United States Patent [19]

Bühler et al.

[11] 4,163,887

[45] Aug. 7, 1979

[54] PULSE GENERATOR FOR ELECTROEROSIVE PROCESSING

[75] Inventors: Ernst Bühler, Tenero; Costantino Tadini, Locarno, both of Switzerland

[73] Assignee: A.G. für industrielle Elektronik AGIE Losone b. Locarno, Losone, Switzerland

[21] Appl. No.: 825,036

[22] Filed: Aug. 16, 1977

[30] Foreign Application Priority Data

Mar. 18, 1977 [CH] Switzerland ............................ 3435/77

[51] Int. Cl.$^2$ ............................................. B23P 1/08
[52] U.S. Cl. ................................ 219/69 P; 219/69 W; 323/23
[58] Field of Search ............. 219/69 P, 69 C, 69 W; 328/14, 61, 63, 72, 73, 74; 307/254, 264; 323/23, 25

[56] References Cited

U.S. PATENT DOCUMENTS

| 3,292,040 | 12/1966 | Ullmann et al. | 219/69 P |
| 3,492,503 | 1/1970 | Bose | 323/23 |
| 3,654,489 | 4/1972 | Knapton | 328/63 |
| 3,815,030 | 6/1974 | Morrison | 328/14 |
| 3,927,365 | 12/1975 | Kodama | 323/25 |
| 3,987,269 | 10/1976 | Inoue | 219/69 C |
| 4,015,192 | 3/1977 | Koyanagi | 323/23 |

FOREIGN PATENT DOCUMENTS

| 1442002 | 2/1965 | France | 219/69 C |
| 1535301 | 8/1968 | France | 219/69 C |

OTHER PUBLICATIONS

Kravchenko, A Thyratrox Pulse Generator for Spark Machining, Electrochemistry in Industrial Processing and Biology, No. 6, Nov./Dec., 1975, pp. 83–85.

*Primary Examiner*—Bruce A. Reynolds
*Attorney, Agent, or Firm*—Frishauf, Holtz, Goodman & Woodward

[57] ABSTRACT

A generator for machining by means of electrical discharges between a tool electrode and a workpiece electrode. The generator consists of a main voltage source connected between the tool electrode and the workpiece electrode through an improved switching circuit which is activated by an adjustable oscillator. The switching circuit delivers short pulses of high pulse current and consists of a plurality of identical impulse amplification stages. A first one of these impulse amplification stages drives all the additional ones. Power transistors are used. With a base current regulating system, the turn-off delay of these power transistors is eliminated by keeping them far away from saturation. Resistance-capacitance and resistance-inductance elements and a special cabling are used to eliminate certain impulse transmission problems.

9 Claims, 11 Drawing Figures

PULSE GENERATOR FOR ELECTROEROSIVE PROCESSING

BACKGROUND OF THE INVENTION

The present invention relates to a pulse generator for electroerosive processing by means of an electrical discharge between a tool electrode and a workpiece electrode, the generator consisting of a main voltage source, an adjustable control oscillator, and a plurality of impulse amplifier switching circuit stages.

As in finishing technology in general, so also in spark erosion processing is there the constant desire for increases in rate of erosion for the process without having to accept therewith excessive increase in tool wear. It is known that the impulses which provide the highest rate of erosion are those which during the short discharge time are able to provide the greatest degree of energy conversion; that is, pulses which within the short discharge period can create an especially strong discharge current. In electroerosive processing, especially in electroerosive cutting, there is a special need for high current short pulses, since in general one need be less concerned about wear of the electrode. The wear can be much more readily compensated for by an increase in the wire travel speed. In the application of high current short impulses, further advantageous use can be made of a shift in the physics of the removal mechanism from a melt removal more to one of removal by vaporization. In connection with the last mentioned type of removal there is the advantage that relatively little degradation of the workpiece surface results, since there arises a very sharp temperature gradient between the material involved in the vaporization and the remainder of the workpiece material. In the use for spark erosion cutting, there appears in practice today the further difficulty that the current impulses, which last for a number of microseconds, have parameters influenced during the course of the discharge by the unavoidable movements (swings) of the sensitive wire electrode. By instituting high current short impulses in the range of one microsecond, elimination of this disturbing influence of the wire on the course of the discharge can be achieved, since the discharge occurs in much too short a time as compared to the movement conditions for the electrode.

It is known in the field of spark erosion to realize the electrical switching circuits of the pulse generator by means of transistors or thyristors. The development of such pulse generators especially designed for spark erosion sinking began in about 1960 and was then already characterized in U.S. Pat. No. 3,292,040, (Ullmann et al). These have in the meantime become public property and are appropriately described even in the industry standards as "static impulse generators". Up to the present point in time, the production of high performance short impulses by means of semiconductors has always remained an unsolved problem, and has commonly been avoided by supplementation with storage means. That is, production transistors have the undesirable characteristic of exhibiting during the course of the impulse an uncontrollable current cut-off delay period. There are indeed known some anti-saturation switch circuits, which bring improvements in the field of signal processing, but which have an absolutely insufficient performance for power circuits. Such switches would also be unusually expensive. Thyristors, on the other hand, require very special measures just to bring them out of their conductive state at all. Besides, these elements are today subjected in manufacturing use to constraints on the operating frequency, the current rise-time, and the voltage rise-time which are too demanding. One can find such arrangements disclosed, for example, in *Radartechnique* (*Radar Handbook*, page 7-85, Merril Skolnik, 1970 Publ. McGraw-Hill). There also came to be known other switching arrangements which for high current short impulses made use of so-called hydrogen-thyratrons such as, for example, in an erosion generator A671.45 described in the periodical "Electrochemistry in Industrial Processing and Biology" No. 6, Nov./Dec. 1975, page 83. These elements do indeed offer very good impulse characteristics, but are subject to the known shortcomings of electron tube technology: excessive operating voltage of several thousand volts, long warmup time, and short lifetime. Besides, thyratrons are too limited in regard to frequency and in principle require for cut-off the same measures as do thyristors.

The invention relates, then, to a generator for electroerosive processing by means of an electrical discharge between a tool electrode and a workpiece electrode, the generator consisting of an oscillator circuit which cyclically switches a current source to the discharge path through power transistors, characterized in that for increasing the removal rate during the erosion process, the power transistors are so controlled through impulse transformers that only so much control current can reach the control electrode of the power transistors as is necessary for suitable forward bias for these elements, in that the surplus control current is transformed up to the suitable output voltage and shunted through diodes to the power electrodes of the power transistors. The invention is further characterized in that the primary winding of the impulse transformer is connected to the first impulse amplifier switching stage of the oscillator switching circuit, that all further impulse amplifier stages are controlled in series with the power transistor of the first one, and that these are connected through current limiting resistors to the output terminal of the generator. The invention is further characterized by the use of compensation circuits (RC elements or LR elements) for compensating for the capacitances and inductances inherent in the transfer between pulse generation and the discharge path, taking into account the arrangement of the cable itself.

DESCRIPTION OF THE PREFERRED EMBODIMENT

Figure 1:
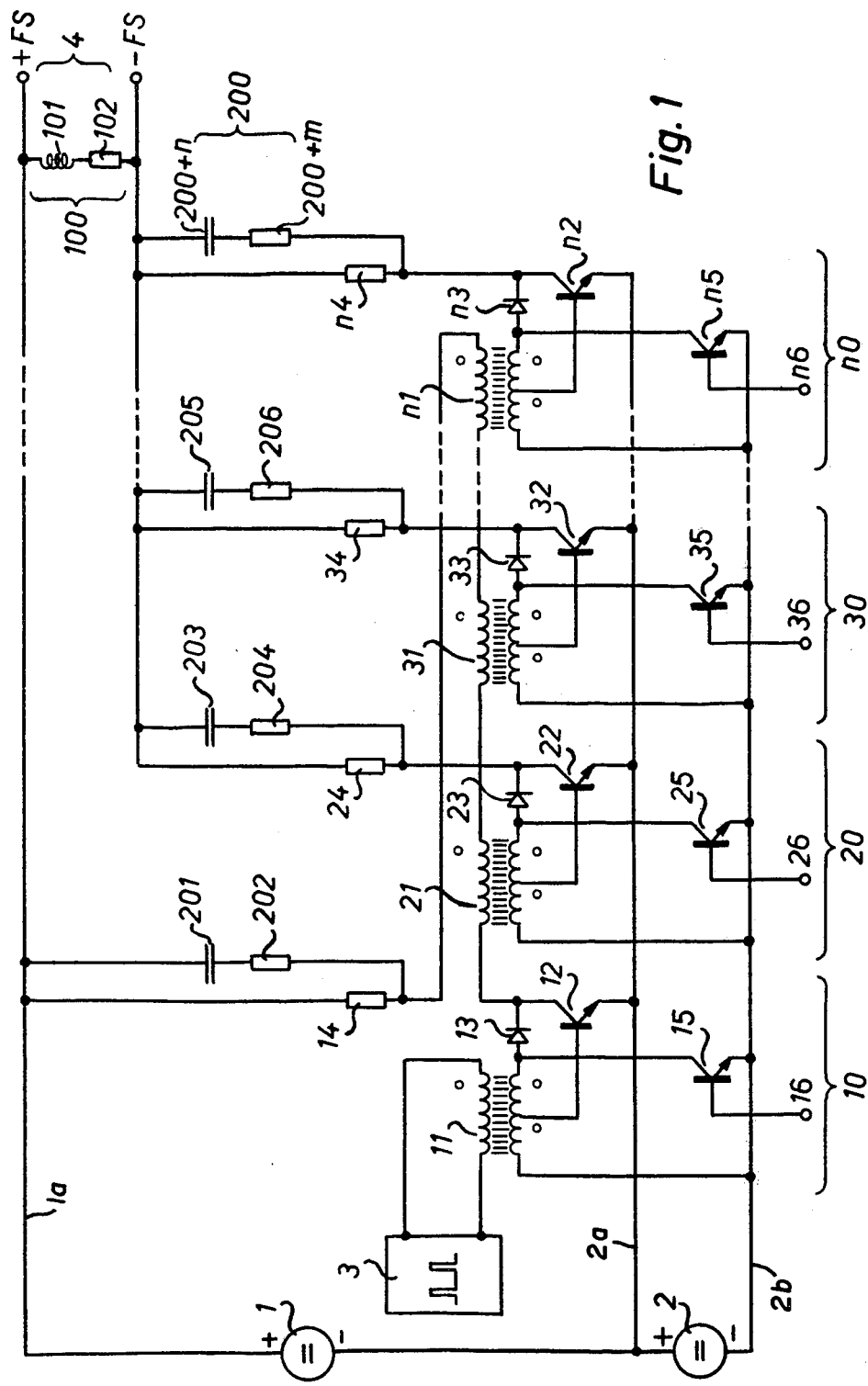
FIG. 1 is a circuit diagram of the principal features of an impulse generator in accordance with a preferred embodiment of the present invention.

Referring now to FIG. 1, the switching circuit for the impulse generator contains a main constant-voltage source 1, from which the discharge path is supplied with high current short impulses through the output terminals 4 and also denated +FS and −FS. The pulse repetition rate of the impulses is determined by an adjustable oscillator 3, which controls the impulse amplification stages 20, 30, n0, which then switch the impulse to the discharge path through the current limiting resistors 24, 34, n4. An identically constructed impulse amplifier stage 10 is used as drive circuit for the additional impulse amplification stages which work into the discharge path. The drive current of this first stage is determined by the current limiting resistor 14 in conjunction with the voltage drop of the primary winding of the impulse transformers 21, 31, n1. The drive circuit has an impulse transformer 11 which transmits the oscillator pulse signals to the drive circuit. The auxiliary constant-voltage source 2 supplies the drive circuit 10 and the impulse amplifier stages 20, 30 n0 with a voltage whose function will be described separately in connection with the explanation of the FIG. 2. By means of the control inputs 16, 26, 36, n6, the control of the drive circuit 10 or that of the impulse amplifier stages 20, 30, n0, can be made to be ineffective with respect to a selected drive circuit by use of transistors 15, 25, 35, n5. The function of the auxiliary transistors 15, 25 . . . n5, when controlled to conduction, is to shunt the control signals on the pulse transformer secondary windings N2, N3 . . . (FIG. 2) of the impulse transformers, thereby inhibiting the operation of a selected one, or more of the power transistors 12, 22 . . . n2 to control the total output current. When the auxiliary transistor 15 is switched on, the whole generator will be blocked, because the drive circuit 10 will no longer deliver the drive pulses to the amplifier stages 20, 30, n0, and under these conditions all the amplifier stages 20, 30, n0 are blocked.

The RC-elements 200 are used to compensate for the inherent conduction inductances of the various switching circuits, with 201/202 being for the drive stage and 203/204, 205/206, 200+n/200+m for the later switched impulse amplifier stages. The inherent capacitance effects are also compensated by the LR-element 100, that is through the inductance 101 and the resistance 102.

Figure 2:
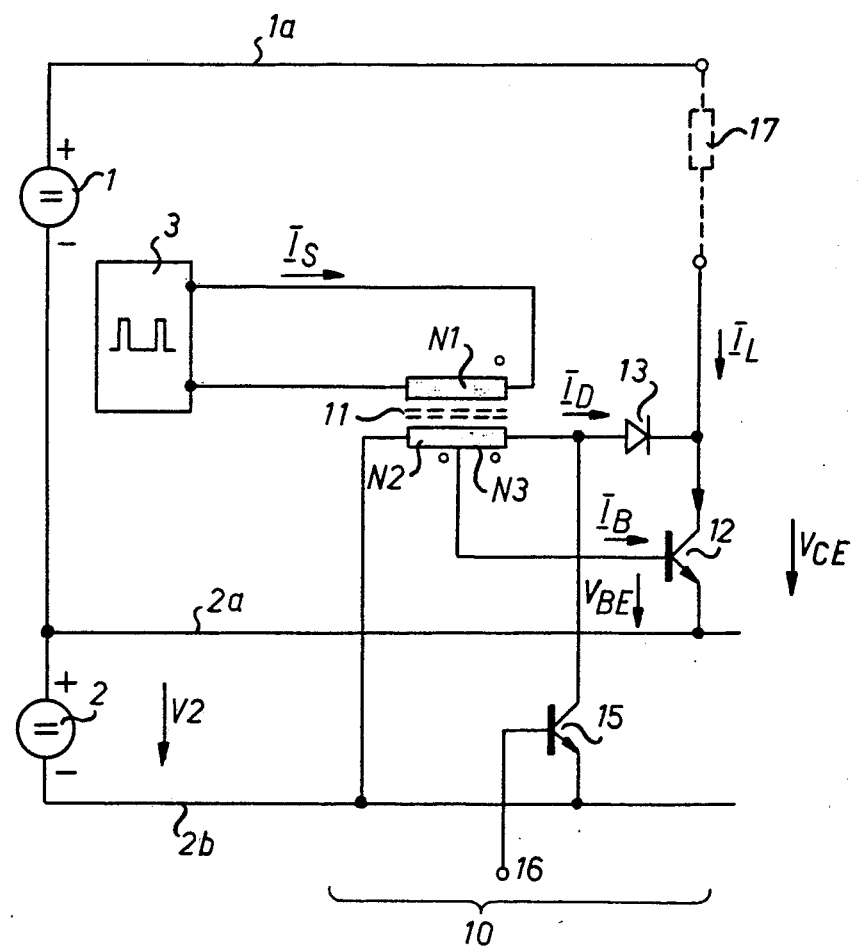
FIG. 2 is a circuit diagram of an impulse amplifier stage of the generator of FIG. 1.
Figure 3A:
FIGS. 3a–d are graphical illustrations of certain aspects of synchronization storage of numerous impulse portions to a combined discharge impulse and show current-time relationships of load currents.
Figure 3B:
Figure 3C:
Figure 3D:
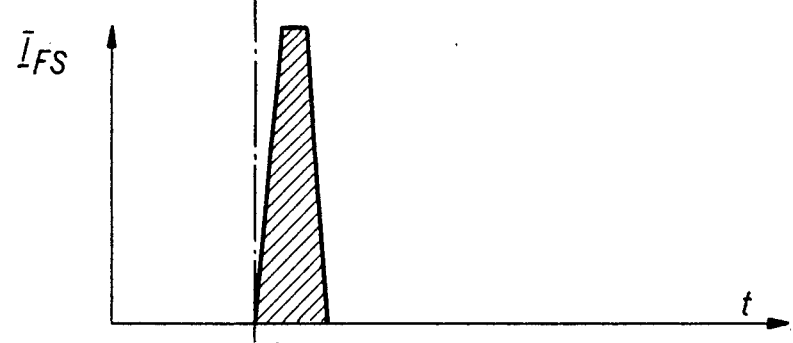
Figure 4A:
FIGS. 4a–d are graphical illustrations of certain aspects of nonsynchronized individual impulses to a combined input pulse.
Figure 4B:
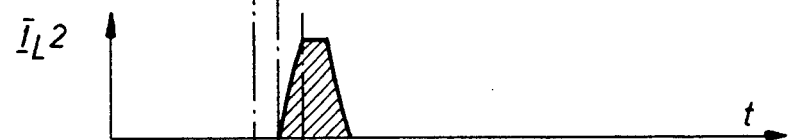
Figure 4C:
Figure 4D:
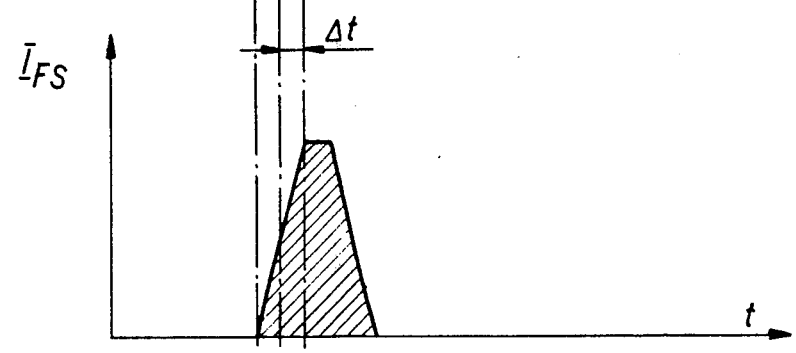

FIG. 2 illustrates the driver stage 10; it can also serve as an example which explains the functioning of impulse amplifier stages 20, 30 . . . n0.

OPERATION

Let it be assumed that transistor 15 is OFF, or blocked. The impulse control current $I_S$ is switched from the adjustable oscillator 3 to the impulse transformer 11. The impulse transformer 11 consists of three windings N1, N2, and N3. The impulse control current $I_S$ is transformed to the secondary side of the transformer 11 and creates in the winding N2 the base current $I_B$ for the power transistor 12. The secondary winding N2 is connected between the conductor 2b of the voltage source 2 and the base of the power transistor 12. Upon the application of a control impulse $I_S$, there appears on this winding N2 the voltage V2 of the voltage source 2 and in addition the forward bias voltage $V_{BE}$ of the power transistor 12, and the base current $I_B$ begins to flow.

The voltage on the winding N2 is also induced in the winding N3 in proportion to N3 relative to N2. The power transistor 12 is switched ON by the base current $I_B$ and draws the power current $I_L$ from the voltage source 1 over the conductor 1a and the power network 17. The power transistor 12 is switched ON until such time as the transistor voltage $V_{CE}$ has dropped to a level at which the diode 13 becomes conductive in a forward direction. At this moment, the current $I_D$ begins to flow and causes a simultaneous reduction in the base current $I_B$, since the control current $I_S$ from sources remains approximately constant. This reduction of the base current $I_B$ causes a drop in conduction of the power transistor 12, i.e. transistor 12 is less strongly switched on, and its voltage $V_{CE}$ again rises. This results in an equilibrium. Assuming that the diode 13 voltage drop and the base voltage drop $V_{BE}$ are ignored.

$$V_{CE} = \text{approximately } (V2) \times (N3/N2)$$

The voltage source 2 may have, for example, a voltage V2 of 5 volts, and the transformer 11 can be constructed, for example, with N1 being 2 windings, N2 being 2 windings, and N3 being 4 windings. With these values there arises a regulated transistor ON-voltage $V_{CE}$ of 5 volts × (4/2) = 10 volts for the power transistor 12. One can see that with the auxiliary voltage source 2 and the construction of the impulse transformers 11, it is possible to set the on-voltage drop $V_{CE}$ of the power transistor 12 at any desired value. Furthermore, during the pause, when there is no control current supplied by source 3, the auxiliary voltage source 2 supplies the bases of the power transistor 12 with a reverse voltage which results in a higher blocking capability and in better current cut-off characteristics.

The relatively high and actively regulated forward bias switching voltage $V_{CE}$ of the power transistor 12 makes possible very fast and undelayed switching OFF. The diode current $I_D$, which is led off through the transistor 12, loads the transistor only to an insignificant extent, since, in accordance with the transformer principle it decreases with increasing voltage in the winding N3 (FIG. 2). Through the control input 16 there can be switched on the auxiliary transistor 15, which shunts on its side the secondary windings N2 and N3 of the pulse transformer 11. The control signals applied to terminals 16, 26 . . . can be any suitable voltage or current signal as well known in the art. By this, the control impulses on the secondary side are all shunted and the base of the power transistor 12 is switched down to the conductor 2b, which then insures blocking thereof. In this way, at any desired time and by generating a suitable control signal for terminals 16, 26 . . . any desired impulse amplifier stage 10, 20, 30, n0 can be switched off in spite of adjacent ON control signals or pulses from source 3. In this way, there is provided a simple and fast means of switching the impulse current to the workpiece electrode.

The additional amplifier stages 20, 30, n0 are identical to the drive circuit stage 10. Only outputs of the additional stages are differently connected (FIG. 1). This does not, however, affect the operation of their circuit components The stages can be considered to be those similar circuit units to the secondary side of the impulse transformers and including the cores.

The operation of the additional impulse amplifier stages 20, 30, n0 is analogous to that of the driving stage 10, since the driving stage 10 and the additional stages 20, 30, n0 are identical on the secondary side of the transformers.

The driving circuit 10 is distinguished only in that the primary coil of its transformer 11 is addressed directly by the oscillator 3 and its output is serially connected to the primaries for addressing the other impulse transformers 21, 31, n1. Thus, for instance in the operation of the additional amplifier stage 20, the impulse control current for the primary of the transformer 21 is the output current of the driving stage 10. The impulse transformer 11 has one primary winding and a first and second secondary winding. In response to the impulse in the primary winding, there appears in the first secondary winding the voltage of the voltage source 2, and this is applied to the base of the power transistor 22 to put it into a conductive state, so that it draws power current from the voltage source 1 and feeds it through resistor 24 to an electrode. The power transistor 22 is switched on until such time as the transistor voltage has dropped to a level at which the diode 23 becomes conducting. At this time, current through the diode results in a simultaneous reduction in the base current, so that the transistor 22 is less strongly switched on.

It can be seen that the total output current from all the impulse amplifier stages 20, 30, n0 may be controlled by inactivating one or more of them by means of the auxiliary shunting transistors 16, 15, 25, n5. This requires merely the application to the control leads 16, 26, n6 of a voltage which will put the particular shunting transistors 15, 25, n5 into a conductive state, thus putting the respective power transistors 12, 22, n2 into a nonconductive or blocked or OFF state. Mechanical selector and other types of switches for selectively applying such control current or voltage signals to the shunting transistors 15, 25, n5 are well known in the art.

The various circuit components of the generator are ones which have been available commercially in at least 1976 or are of such a nature as to be readily obtainable by one of ordinary skill in the art of pulse generators as follows:

power transistors 12, 22, 32, n2 product 2N6590, from TRW Co. (USA)
diodes 13, 23, 33, n3 product MR 1366, from Motorola Corp. (USA)
main voltage source a D.C. power supply with 50–450 volts output, depending upon the chosen no-load pulse voltage
auxiliary voltage source 2 a D.C. power supply with 1–9 volts output, depending upon the chosen forward bias voltage for the transistors 12–n2
resistor 14 chosen for desired drive current, e.g. 4 amps at chosen main voltage source voltage
pulse transformers 11, 21, 31, n1 constructed from a toroidal core product D1, from Krupp (German Federal Republic)
RC elements 200 values chosen empirically to match the inherent inductance
LR elements 100 values chosen empirically to match the inherent capacitance The impulse amplifier stages 10, 20, 30, n0 can be constructed with the impulse transformers 11, 21, 31, n1 which are saturable so that they become saturated after a predetermined pulse length, thereby no longer delivering a signal on the secondary side and also thereby themselves preventing an overloading of the power transistors 12, 22, 32, n2 in the event of a faulty control signal. This makes possible a meaningful savings in the dimensioning of the power elements, since they need be designed to carry the impulse traffic alone. The transformers, upon saturation, place the power transistors 12, 22, 32, n2 of the impulse amplifier switch into blocked or non-conductive stage.

The FIGS. 3 and 4 show the importance of acceptably timely synchronizing of the individual impulse amplifier stages 20, 30, n0. The FIGS. 3a, 3b, 3c show by way of example three acceptably synchronized impulse currents $I_L1$, $I_L2$, and $I_L3$, which are summed at the common output terminal of the generator switch −FS and affect there the sum impulse $I_{FS}$. One sees immediately that the impulse height of these combined impulses becomes equal to the sum of the individual impulse heights of the member impulses. The flank portions of the combined impulse become visibly greater as that of the individual member impulses, since the on and off switching times remain the same. The FIGS. 4a, 4b, and 4c show again three individual impulses $I_L1$, $I_L2$ and $I_L3$ which in the meantime are displaced in time only to the amount of their on times, $\Delta t$. The combined impulse in FIG. 4d of this poorly synchronized individual impulse reaches a flank portion magnitude which is only approximately equal to the individual impulse and a height which corresponds to only about one third of the sum of the impulse heights of the individual impulses. The difference between a working impulse such as in FIG. 3d and that in FIG. 4d is apparent. One sees that with high current short impulses the main problem consists of the creation of steep individual impulses and with their acceptable timely synchronization. These problems are solved in an ideal fashion with the switching arrangement as described in the FIG. 2 and with the series switching of the primary windings of the impulse transformers 21, 31, to n1 in accordance with FIG. 1.

Figure 5:
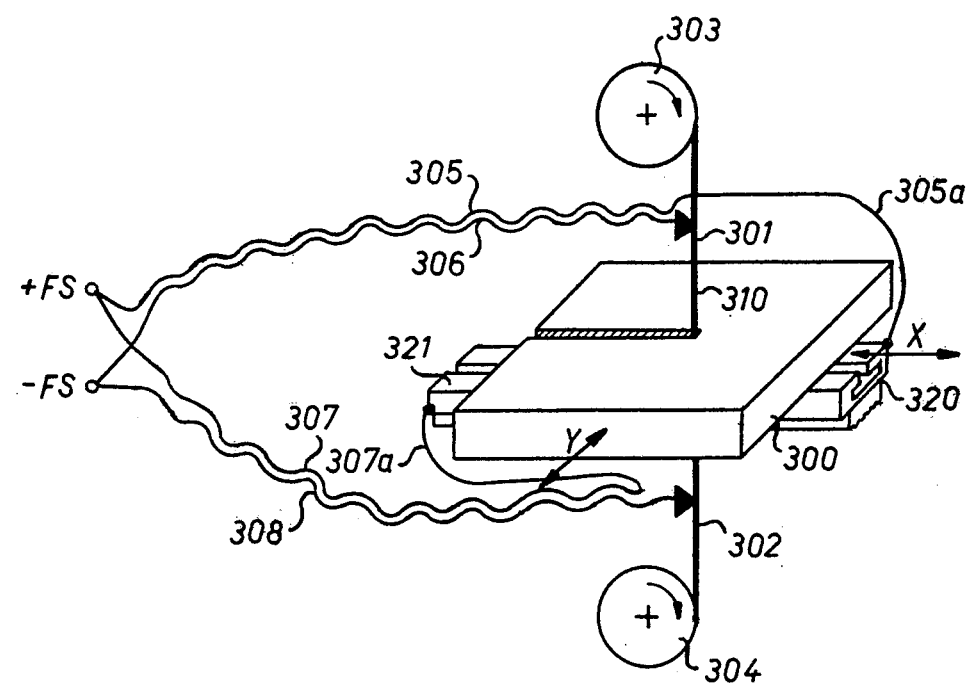
FIG. 5 is a partly diagrammatic perspective view of an apparatus in accordance with the preferred embodiment of the invention showing the arrangement of the output lines from the impulse generator to the discharge path.

FIG. 5 shows a proposed embodiment for the wiring from the generator output terminal +FS/−FS to the workpiece chamber of the spark erosion wire cutting machine. Since to date such wire cutting machines reach significant dimensional proportions, with the raceways of the axes already being commonly nearly 1 meter long, the wiring for the utilization of high current short impulses takes on particular significance. From the output terminals of the generator circuit +FS/−FS the current impulses are advantageously brought through a plurality of twisted conductor pairs 305, 306 resp. 307, 308 (of which only one pair is shown) into the work chamber of the machine. The tool 300 accomplishes in known fashion the movement corresponding to the cut contour and relative to the wire electrode 310 in the two axes X and Y. The wire electrode 310 is rolled off a wire supply roll 303, and after having passed the erosion zone is rolled up on the roll 304. The current impulses are carried over to the wire electrode 310 through the contacts 301 and 302. The arrangement in accordance with the invention provides that the conductor pairs 305, 306, resp. 307, 308 are twisted until the vicinity of the current contacts, with the result that the conductors 305a and 307a are brought to the mounting tales 321 left and 320 right in the tightest possible loop.

These loops are so arranged that with any table movement whatever, the one loop will be enlarged as much as the other will be reduced, with the goal of holding constant the resultant inductance in the working chamber, while at the same time making possible unhindered working. Thereby, and in connection with the measures for the compensation of the conductor inductances as they are described in connection with the FIG. 1, it is possible to supply also large machines with acceptable short impulses.

We claim:

1. A pulse generator for electroerosive processing by means of electrical discharges between a tool electrode and a workpiece electrode, consisting of a main voltage source connected with two output terminals of the generator between the tool electrode and the workpiece electrode through a switching circuit which is activated by an adjustable oscillator, the improved switching circuit therein comprising:
   an auxiliary voltage source,
   at least two identical impulse amplification stages, each comprising:
      an impulse transformer having a primary winding and also having first and second secondary windings,
      said first secondary winding being connected between the first side of said auxiliary voltage source and a base of a power transistor, and said second secondary winding being connected between said base and through a diode to a collector of said power transistor,
      an emitter of said power transistor being connected to the other side of said auxiliary voltage source and also to one side of said main voltage source, the other side of said main voltage source being connected to one of said output terminals.
   said primary winding of said transformer being for the first of said stages connected to said oscillator, and said primary winding for all additional said stages being connected in series between said collector of said power transistor of said first stage and through a current-limiting resistor to said other side of said main voltage source, the collector of said power transistor of all additional said stages being connected through current-limiting resistors to the other of said output terminals.

2. The generator defined in claim 1 and comprising:
   resistance-capacitance elements connected in parallel with said current-limiting resistors of said stages, and
   an inductance-resistance element connected between said output terminals.

3. The generator defined in claim 1 and comprising for each of said stages:
   an auxiliary transistor with:
      collector and emitter connected between said first side of said auxiliary voltage source and said diode which is connected to said second secondary winding of said transformer, and
      a base connected to a control input terminal of said stage.

4. The generator defined in claim 1, wherein said transformers of said stages are of a saturable core type.

5. The generator defined in claim 1 wherein said output terminals of the generator are connected to a working chamber of the erosion machine through twisted pairs of lines, whereby one polarity of the generator output is connected to the current supply contacts of the tool electrode and the other polarity is wired from the vicinity of said current supply contacts to mounting tables in the shortest possible loops to the right and to the left of the workpiece electrode, the loop size lefthand always increasing or decreasing to the same degree to which the loop size righthand decreases or increases with any movement of the workpiece electrode.

6. The generator defined in claim 5, wherein said transformers of said stages are of a saturable core type.

7. The generator defined in claim 5 and comprising:
   resistance-capacitance elements connected in parallel with said current-limiting resistors of said stages, and
   an inductance-resistance element connected between said output terminals.

8. The generator defined in claim 7, wherein said transformers of said stages are of a saturable core type.

9. The generator defined in claim 8 and comprising for each of said stages:
   an auxiliary transistor with:
      collector and emitter connected between said first side of said auxiliary voltage source and said diode which is connected to said second secondary windings of said transformer, and
      a base connected to a control input terminal of said stage.

* * * * *